US009446565B2

(12) United States Patent
Hughes et al.

(10) Patent No.: US 9,446,565 B2
(45) Date of Patent: Sep. 20, 2016

(54) STEEL ARMOR WIRE COATINGS

(71) Applicant: Schlumberger Technology Corporation, Sugar Land, TX (US)

(72) Inventors: Trevor Hughes, Cambridge (GB); Joseph Varkey, Sugar Land, TX (US); Vadim Protasov, Houston, TX (US); Evgeny Barmatov, Cambridge (GB); Paul Wanjau, Missouri City, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 14/470,708

(22) Filed: Aug. 27, 2014

(65) Prior Publication Data

US 2016/0059519 A1 Mar. 3, 2016

(51) Int. Cl.
| | |
|---|---|
| *B32B 15/00* | (2006.01) |
| *B32B 15/01* | (2006.01) |
| *C22C 18/00* | (2006.01) |
| *C22C 30/06* | (2006.01) |
| *C22C 27/04* | (2006.01) |
| *C23C 2/06* | (2006.01) |
| *C23C 16/06* | (2006.01) |
| *C23C 28/02* | (2006.01) |
| *C25D 7/06* | (2006.01) |
| *C23C 2/02* | (2006.01) |
| *C23C 2/26* | (2006.01) |
| *C23C 2/38* | (2006.01) |

(52) U.S. Cl.
CPC ............ *B32B 15/015* (2013.01); *B32B 15/013* (2013.01); *C22C 18/00* (2013.01); *C22C 27/04* (2013.01); *C22C 30/06* (2013.01); *C23C 2/02* (2013.01); *C23C 2/06* (2013.01); *C23C 2/26* (2013.01); *C23C 2/38* (2013.01); *C23C 16/06* (2013.01); *C23C 28/021* (2013.01); *C23C 28/025* (2013.01); *C25D 7/0607* (2013.01)

(58) Field of Classification Search
None
See application file for complete search history.

(56) References Cited

U.S. PATENT DOCUMENTS

| | | | | |
|---|---|---|---|---|
| 3,749,558 | A * | 7/1973 | Dillenschneider | ......... B21C 9/00 428/606 |
| 5,380,407 | A * | 1/1995 | Yamaoka | ................ C23C 26/00 205/122 |
| 7,300,706 | B2 * | 11/2007 | Adriaensen | ............... C23C 2/02 427/357 |

OTHER PUBLICATIONS

Boonyongmaneerat, et al. "Corrosion Behavior of Reverse-Pulse Electrodeposited Zn—Ni Alloys in Saline Environment," J. Materials Engineering & Performance, Jan. 2014, vol. 23, No. 1, pp. 302-307.

(Continued)

*Primary Examiner* — Daniel J Schleis
(74) *Attorney, Agent, or Firm* — Trevor Grove

(57) ABSTRACT

A wire includes a ferrous core. The ferrous core can be coated. The coatings can include nickel, molybdenum, zinc and Fe. A process of forming a wire can include placing a metal strip alongside a ferrous wire core, bending the strip around the core, and seam welding the strip to form a metal tube around the core. The process of forming a wire can include applying a metal layer to a ferrous metal rod to form a plated rod, placing a metal strip alongside the rod, bending the strip around the rod, and seam welding the strip to form a metal tube around the rod. The process of forming a wire can include coating a ferrous wire core with a layer of nickel, molybdenum or a nickel alloy that circumferentially surrounds the ferrous wire core.

10 Claims, 10 Drawing Sheets

(56) References Cited

OTHER PUBLICATIONS

Conde, et al. "Electrodeposition of Zn—Ni coatings as Cd replacement for corrosion protection of high steel," Corr. Sci., 2011, vol. 53, pp. 1489-1497.

Conrad, et al. "Electrochemical Deposition of γ-Phase Zinc—Nickel Alloys from Alkaline Solution," J. Electrochem. Soc., 2012, vol. 159, No. 1, pp. C29-C32.

Dafydd, et al. "The kinetics and mechanism of cathodic oxygen reduction on zinc and zinc—aluminium galvanized alloys," Corr. Sci., 2005, vol. 47, pp. 3006-3018.

Eliaz, et al. "Electroplating and characterization of Zn—Ni, Zn—Co and Zn—Ni—Co alloys," Surface & Coatings Technology, 2010, vol. 205, pp. 1969-1978.

Hammami, et al. "Influence of Zn—Ni alloy electrodeposition techniques on the coating corrosion behavior in chloride solution," Surface & Coatings Technology, 2009, vol. 203, pp. 2863-2870.

Hammami, et al. "Effect of phosphorus doping on some properties of electroplated Zn—Ni alloy coatings," Surface & Coatings Technology, 2013, vol. 219, pp. 119-125.

Hosking, et al. "Corrosion resistance of zinc—magnesium coated steel," Corr. Sci., 2007, vol. 49, pp. 3669-3695.

Keppert, et al. "Influence of pH value on the corrosion of Zn—Al—Mg hot-dip galvanized steel sheets in chloride containing environments," NACE Corrosion 2012, paper C2012-0001493, 15 pages.

Khan, et al. "Corrosion behavior of zinc—nickel alloy coatings electrodeposited in additive free chloride baths," Corr. Eng. Sci & Tech., 2011, vol. 46, No. 7, pp. 755-761.

Kubisztal, et al. "Corrosion Resistance of Zn—Ni—P+Ni composite coatings," Surf. Interface Anal., 2010, vol. 42, pp. 1222-1225.

Lichušina, et al. "Cobalt-rich Zn—Co alloys: electrochemical deposition, structure and corrosion resistance," CHEMIJA, 2008, vol. 19, No. 1, pp. 25-31.

Long, et al. "Effect of Triethanolamine Addition in Alkaline Bath on the Electroplating Behavior, Composition and Corrosion Resistance of Zn—Ni Alloy Coatings," Advanced Materials Research, 2013, vol. 738, pp. 87-91.

Møller "Evaluation of Atmospheric Corrosion of Electroplated Zinc and Zinc—Nickel Coatings by Electrical Resistance (ER) Monitoring," NASF Surface Technology White Papers, Jan. 2014, vol. 78, No. 5, pp. 1-10.

Mosavat, et al. "Study of corrosion performance of electrodeposited nanocrystalline Zn—Ni alloy coatings," Corr. Sci., 2012, vol. 59, pp. 81-87.

Okafor, et al. "Effect of Zinc Galvanization on the Microstructure and Fracture Behavior of Low and Medium Carbon Structural Steels," Engineering, 2013, vol. 5, pp. 656-666.

Panek, et al. "Electrodeposition and the properties of composite Zn+Ni coatings," Surf. Interface Anal., 2010, vol. 42, pp. 1226-1230.

Rahsepar, et al. "Corrosion study of Ni/Zn compositionally modulated multilayer coatings using electrochemical impedance spectroscopy", Corr. Sci., 2009, vol. 51, pp. 2537-2543.

Rao, et al. "Nanofabricated Multilayer Coatings of Zn—Ni Alloy for Better Corrosion Protection," Protection of Metals and Physical Chemistry of Surfaces, 2013, vol. 49, No. 6, pp. 693-698.

Rao, et al. "Magnetically induced electrodeposition of Zn—Ni alloy coatings and their corrosion behaviors," J. Magnetism & Magnetic Materials, 2013, vol. 345, pp. 48-54.

Schuerz, et al. "Corrosion behavior of Zn—Al—Mg coated steel sheet in sodium chloride-containing environment" Corr. Sci., 2009, vol. 51, pp. 2355-2363.

Seré, et al. "Comparative corrosion behaviour of 55Aluminium—Zinc Alloy and Zinc hot-dip coatings deposited on low carbon steel substrates," Corr. Sci., 1998, vol. 40, No. 10, pp. 1711-1723.

Singh, et al. "Electrochemical formation and corrosion studies of zinc—nickel alloys," J. Indian Chem. Soc., 2004, vol. 81, pp. 1149-1155.

Sriraman, et al. "Characterisation of corrosion resistance of electrodeposited Zn—Ni, Zn and Cd coatings," Electrochimica Acta, 2013, vol. 105, pp. 314-323.

Szczygiel, et al. "Influence of molybdenum on properties of Zn—Ni and Zn—Co alloy coatings," Surface & Coatings Technology, 2010, vol. 204, pp. 1438-1444.

Thangaraj, et al. "Electrodeposition and compositional behavior of Zn—Ni alloy," Indian J. Chemical Technology, May 2007, vol. 14, pp. 246-252.

Vaes, et al. "Cathodic Inhibition Effects during NiFe and ZnNi alloy deposition," J. Electrochem. Soc., 2002, vol. 149, No. 11, pp. C567-0572.

You-yang, et al. "A Simple and Convenient Chemical Analysis Method for Nickel Content in Zinc—nickel Alloy Coating," Corrosion & Protection, 2010, vol. 31, No. 4, pp. 307-309. (English Abstract Only).

Yu, et al. "Prepartion of ZnNi alloy films by electrodeposition", Surface Engineering, 2013, vol. 29, No. 10, pp. 743-748.

\* cited by examiner

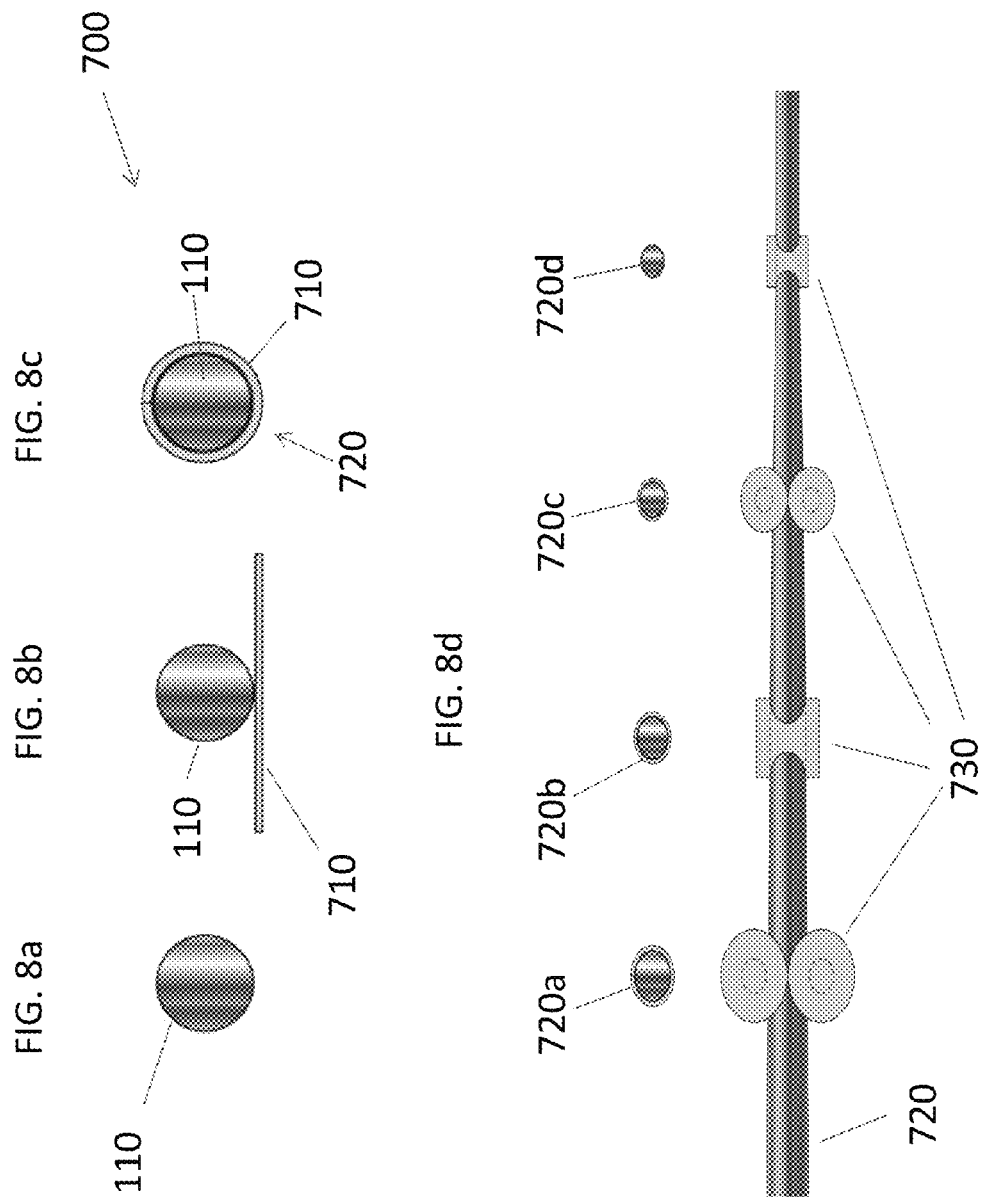

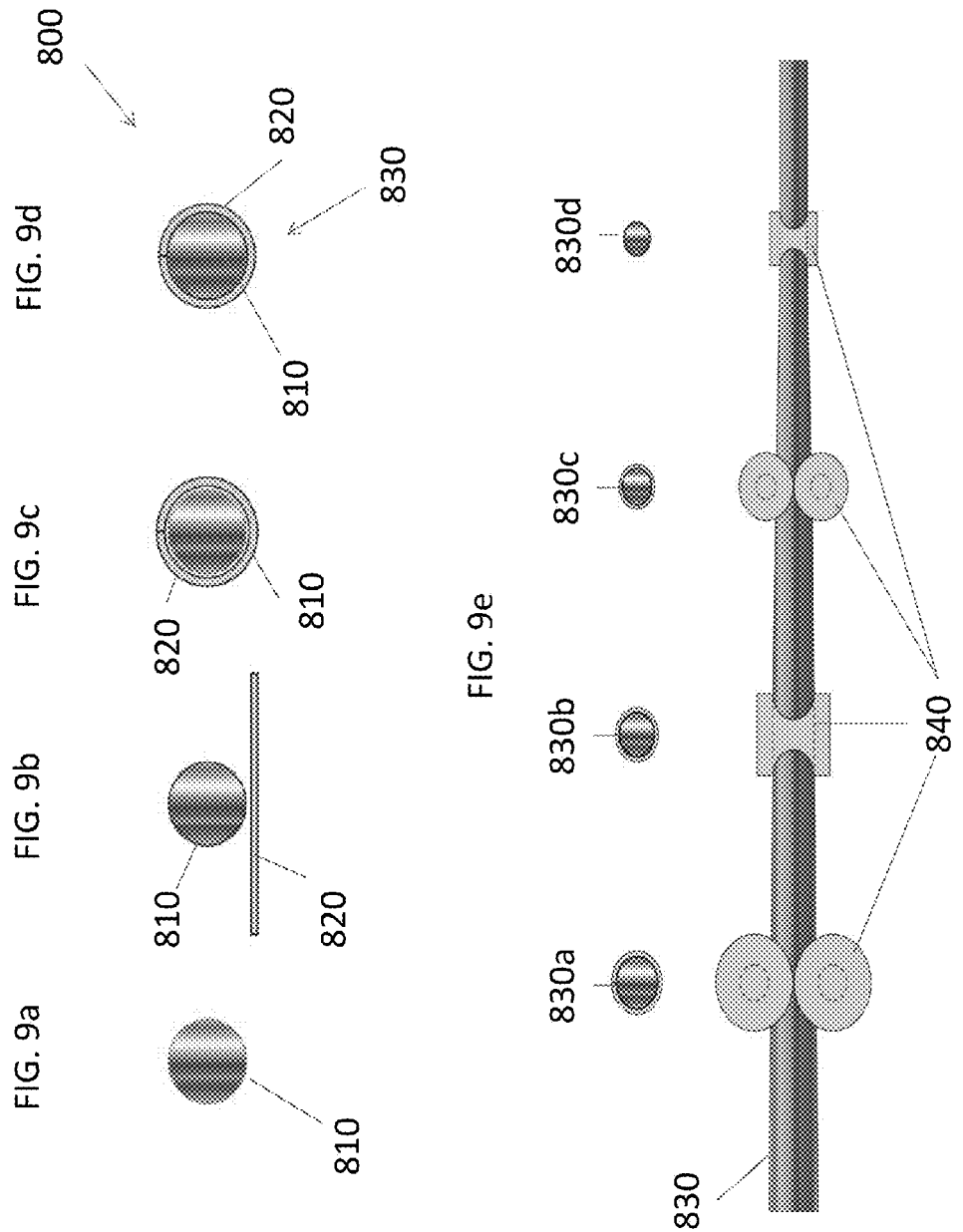

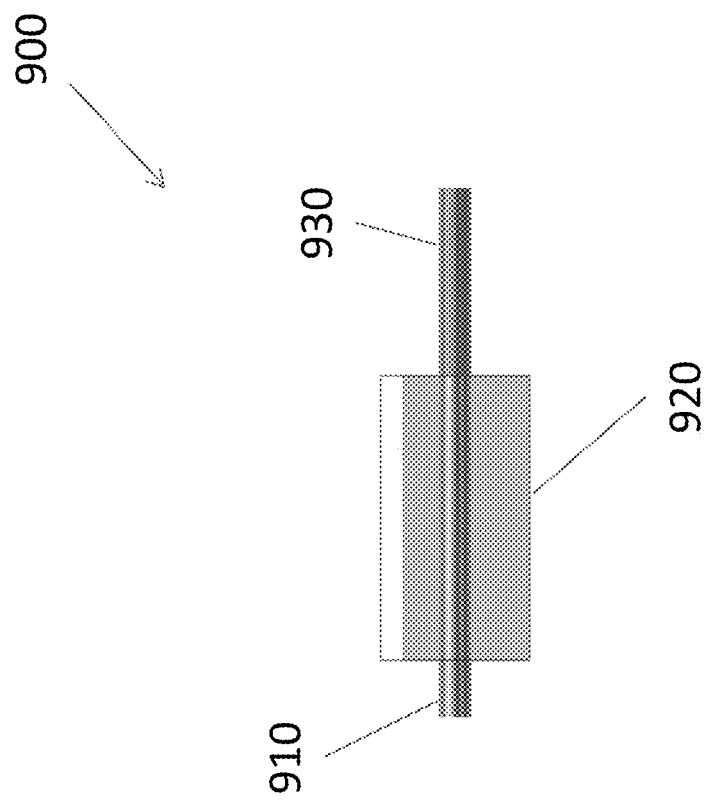

STEEL ARMOR WIRE COATINGS

TECHNICAL FIELD/FIELD OF THE DISCLOSURE

The present disclosure relates to steel armor wire strength member coating compositions, structures, and processes.

BACKGROUND OF THE DISCLOSURE

Armor wire strength members used in wireline cables for oilfield applications are often composed of galvanized improved plow steel (GIPS). In GIPS armor wire strength members, the steel substrate is coated with zinc via a hot dip galvanization process. The hot dip galvanization process involves immersion of the steel substrate in molten zinc at a temperature of around 860° F. (460° C.).

The strength and hardness of unalloyed zinc are greater than those of tin or lead, but less than those of aluminum or copper. Except when very pure, zinc is brittle at ambient temperatures, but zinc becomes ductile at around 100° C. Pure zinc rapidly recrystallizes after deformation at ambient temperature because of the high mobility of the atoms within the lattice. Thus, zinc typically cannot be work-hardened at ambient temperature.

Hot dip zinc coatings provide corrosion protection in a range of atmospheric and low temperature aqueous environments such as humid atmospheric conditions, natural weathering conditions, soil environments, salt-spray testing conditions and under low temperature aqueous/brine immersion conditions. This corrosion protection may be relevant when GIPS armor wire components of wireline cables are stored between wireline logging operations.

Zinc-based coatings may fall into several categories: pure zinc, zinc-iron, zinc-aluminum, zinc-nickel and zinc composites. In terms of manufacturing methods, zinc coatings are produced by hot-dipping, electroplating, mechanical bonding, sherardizing and thermal spraying. The hot-dip methods are further divided into two processes: (1) the continuous process in which long strands of sheet, wire or tubing are continuously fed through a bath of molten zinc; and (2) the batch process in which fabricated parts such as fasteners, poles or beams are dipped into molten zinc, either individually or in discrete batches. Similarly, zinc electroplating can be performed in a continuous or batch mode.

SUMMARY

The present disclosure provides a wire and a process of forming a wire.

Embodiments of the wire can include a ferrous wire core, an interface layer circumferentially surrounding the ferrous wire core, and an outer layer circumferentially surrounding the interface layer. The interface layer can include nickel, molybdenum or a nickel alloy, for example. The outer layer can include zinc or a zinc alloy, for example.

Embodiments of the wire can include a ferrous wire core, an inner zinc layer circumferentially surrounding the ferrous wire core, an Fe layer circumferentially surrounding the inner zinc layer, and an interface layer circumferentially surrounding the Fe layer. The interface layer can include nickel or molybdenum, for example.

Embodiments of the wire can include a ferrous wire core and a layer circumferentially surrounding the ferrous wire core. The layer circumferentially surrounding the ferrous wire core can include nickel, molybdenum or a nickel alloy. The layer circumferentially surrounding the ferrous wire core can be present without an overlying zinc or zinc alloy layer. The layer including nickel, molybdenum or a nickel alloy can act as a protective layer in oil and gas downhole conditions and in surface storage conditions.

Embodiments of the process of forming a wire can include placing a metal strip alongside a ferrous wire core. The metal strip can include Zn, Ni, Mo, or Fe, for example. The process can include bending the metal strip circumferentially around the ferrous wire core. The process can include seam welding the metal strip to form a metal tube around the ferrous wire core.

Embodiments of the process of forming a wire can include applying a metal layer to a ferrous metal rod to form a plated rod. The metal layer can include Zn, Ni, or Mo, for example. The process can include placing a metal strip alongside the plated rod. The metal strip can include Zn, Ni, Mo, or Fe, for example. The process can include bending the metal strip circumferentially around the plated rod. The process can include seam welding the metal strip to form a metal tube around the plated rod.

The process of forming a wire can include coating a ferrous wire core with a layer of nickel, molybdenum or a nickel alloy. The layer can circumferentially surround the ferrous wire core. The layer circumferentially surrounding the ferrous wire core can be present without an overlying zinc or zinc alloy layer.

BRIEF DESCRIPTION OF THE DRAWINGS

The present disclosure can be understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 8a-8d depict a method of forming a wire consistent with at least one embodiment of the present disclosure.

FIGS. 9a-9e depict a method of forming a wire consistent with at least one embodiment of the present disclosure.

FIG. 10 depicts a hot dip galvanizing process consistent with at least one embodiment of the present disclosure.

DETAILED DESCRIPTION

Figure 1:
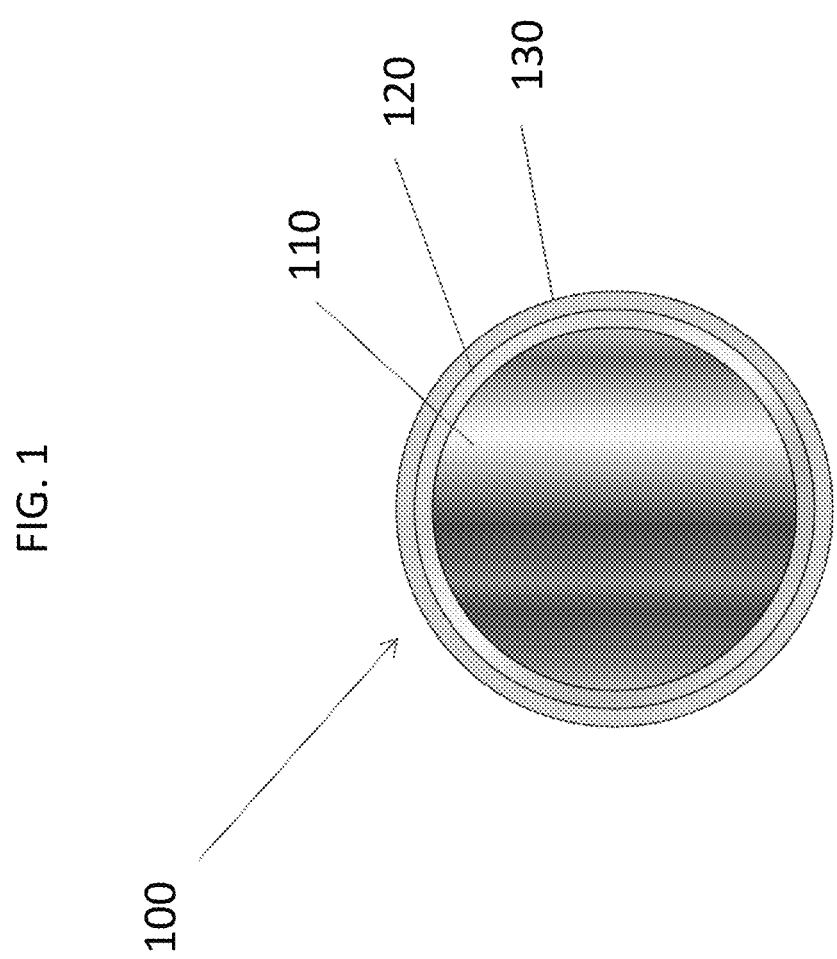
FIG. 1 is a first cross sectional view of steel armor wire consistent with at least one embodiment of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Wireline is a single-strand or multi-strand wire or cable for intervention in oil or gas wells. A wireline is commonly used in association with electric logging and cables incorporating electrical conductors. In certain circumstances, it may be desirable to augment the wire or cable to provide it with additional strength or resistance to adverse temperature or other environmental conditions. Such augmented wireline is termed "armor wire."

FIG. 1 depicts wire 100 consistent with at least one embodiment of the present disclosure. Wire 100 includes ferrous wire core 110. One non-limiting example of a ferrous wire core is a steel wire. Interface metal layer 120 circumferentially surrounds ferrous wire core 110. Interface metal layer 120 may be composed of, for instance, nickel, molybdenum, or nickel-rich alloy. In certain embodiments, interface metal layer 120 may have a thickness of between 2 and 60 microns. Outer layer 130 circumferentially surrounds interface metal layer 120. Outer layer 130 may be composed of zinc or a zinc alloy. The zinc alloy may include, but is not limited to, a binary Zn—Ni or Zn—Co alloy or a ternary Zn—Ni—Co, Zn—Ni—Mo or Zn—Co—Mo alloy. In certain embodiments, outer layer 130 may have a thickness of from about 1 to about 50 microns. Without being bound by theory, it is believed that the interposition of the interface metal layer 120 between ferrous wire core 110 and outer layer 130 acts as a barrier protection for the ferrous wire core 110 when wire 100 is exposed to harsh temperature and other environmental conditions, such as those that exist downhole in oil and gas fields. Further, without being bound by theory, it is believed that the zinc or zinc alloy in outer layer 130 provides sacrificial protection of the underlying layers during storage, such as wireline cable storage conditions between successive wireline logging jobs.

Figure 2:
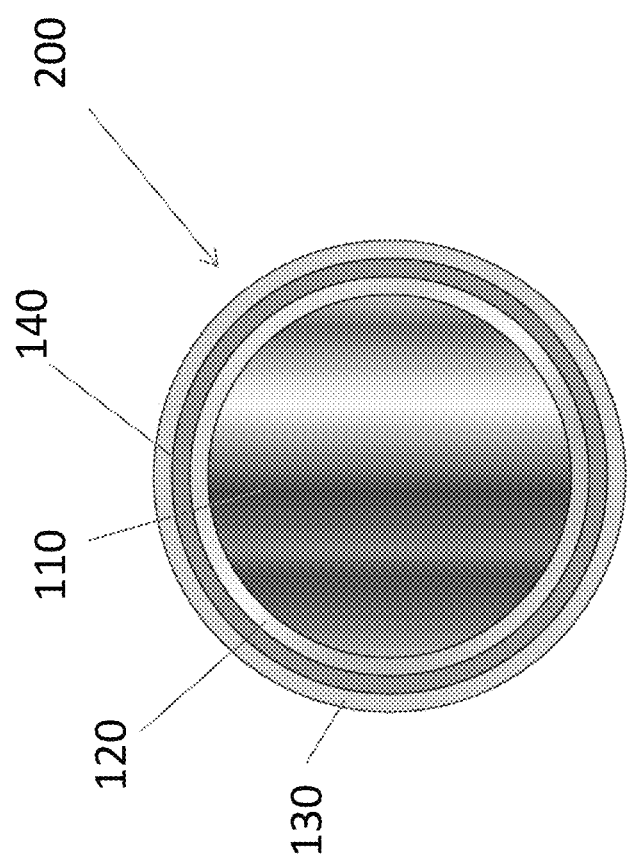
FIG. 2 is a second cross sectional view of steel armor wire consistent with at least one embodiment of the present disclosure.

FIG. 2 depicts wire 200 consistent with at least one embodiment of the present disclosure. Wire 200 includes ferrous wire core 110. One non-limiting example of a ferrous wire core 110 is a steel wire. Interface metal layer 120 circumferentially surrounds ferrous wire core 110. Interface metal layer 120 may be composed of nickel or molybdenum. In certain embodiments, interface metal layer 120 may have a thickness of from about 2 to about 50 microns. Without being bound by theory, interface metal layer 120 may serve as a stop layer for corrosion if the outer layer 130 (described below) is compromised. In the embodiment depicted in FIG. 2, Fe layer 140 circumferentially surrounds interface metal layer 120. In certain embodiments, Fe layer 140 may have a thickness of from about 2 to about 20 microns. Without being bound by theory, it is believed that nickel contact with the environment may increase brittleness, and Fe layer 140 may reduce such contact and increase the longevity of wire 200. Outer layer 130 circumferentially surrounds Fe layer 140. Outer layer 130 may be composed of zinc or a zinc alloy. The zinc alloy can include, but is not limited to, a binary Zn—Ni or Zn—Co alloy, or a ternary Zn—Ni—Co, Zn—Ni—Mo or Zn—Co—Mo alloy. In certain embodiments, outer layer 130 may have a thickness of between 1 and 50 microns.

Figure 3:
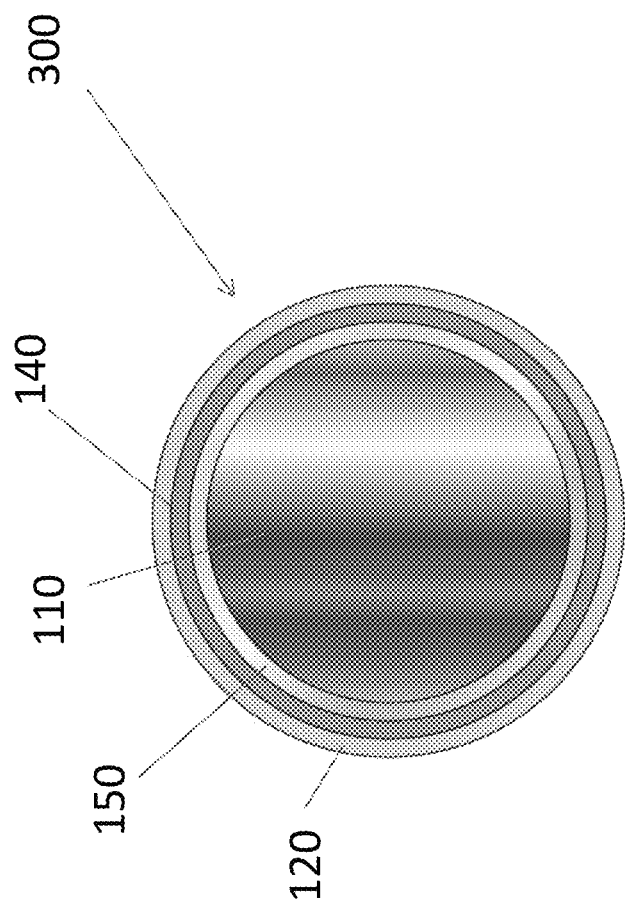
FIG. 3 is a third cross sectional view of steel armor wire consistent with at least one embodiment of the present disclosure.

FIG. 3 depicts wire 300 consistent with at least one embodiment of the present disclosure. Wire 300 includes ferrous wire core 110. One non-limiting example of ferrous wire core 110 is a steel wire. Inner zinc layer 150 circumferentially surrounds ferrous wire core 110. In certain embodiments of the present disclosure, inner zinc layer 150 is between 2 and 50 microns in thickness. In the embodiment depicted in FIG. 3, Fe layer 140 circumferentially surrounds inner zinc layer 150. In certain embodiments, Fe layer 140 may have a thickness of between 2 and 20 microns. Interface metal layer 120 circumferentially surrounds Fe layer 140 and may be composed of nickel or molybdenum. In certain embodiments, interface metal layer 120 may have a thickness of from about 2 to about 50 microns.

Figure 4:
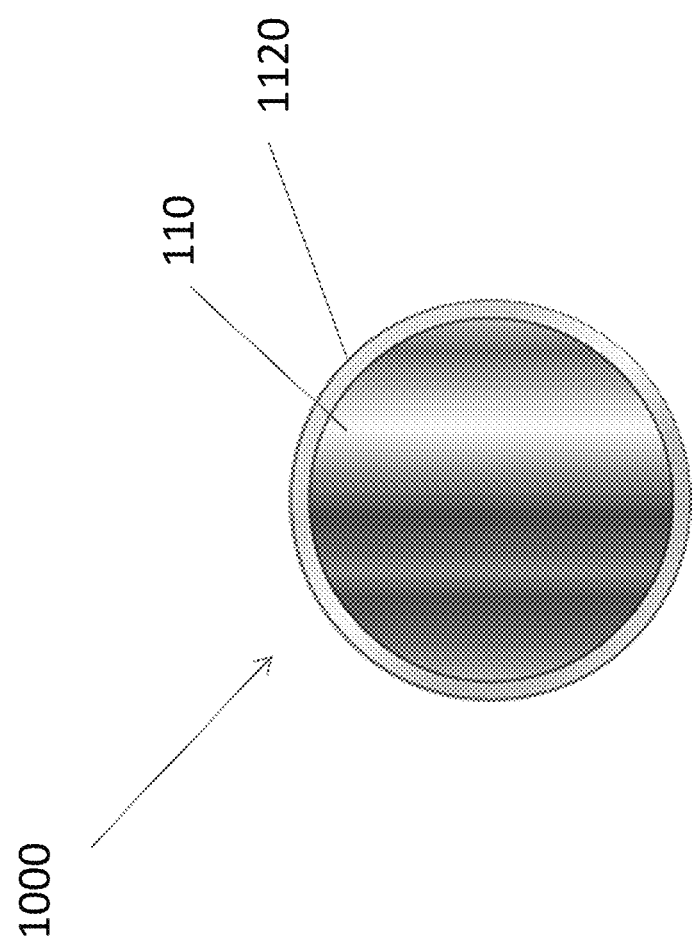
FIG. 4 is a fourth a cross sectional view of steel armor wire consistent with at least one embodiment of the present disclosure.

FIG. 4 depicts a cross sectional view of wire 1000. Wire 1000 includes ferrous wire core 110. Wire 1000 includes a layer 1120, such as a Ni, Mo, or Ni alloy coating, circumferentially surrounding the ferrous wire core 110. The layer 1120 circumferentially surrounding the ferrous wire core 110 can be present without an overlying zinc or zinc alloy layer. The layer 1120 can act as a protective layer in oil and gas downhole conditions and in surface storage conditions.

The successive metal layers depicted in FIGS. 1-4 may be deposited by any number of methods, including but not limited to gas plasma, electrolytic plasma, electroplating, electrodeposition, cladding, or a combination of such methods.

Figure 5:
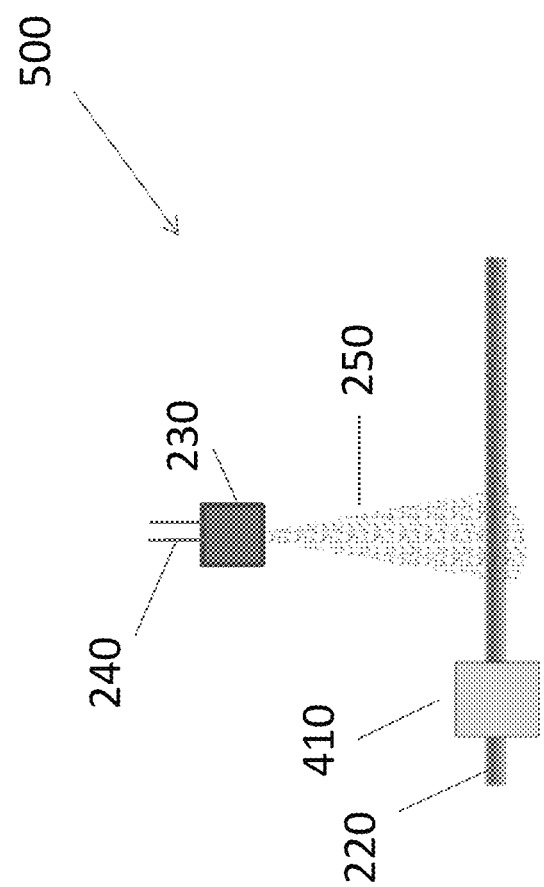
FIG. 5 depicts a gas plasma coating system consistent with at least one embodiment of the present disclosure.

In certain embodiments, the metal to be deposited is plated onto the surface of the wire or other metal object via gas plasma coating. As depicted in FIG. 5, gas plasma coating system 500 includes infrared heat source 410. Prior to processing, wire or other metal object 220, such as a metallic tool, is passed through infrared heat source 410 to increase the temperature of wire or other metal object 220 to enhance bonding. Gas plasma coating system 500 applies positive and negative energy to two metal wires 240 as the metal wires 240 are fed through gun head 230. As the positive and negative metal wires 240 arc, the metal in the two metal wires 240 becomes molten and is then sprayed using dry compressed air 250 onto wire or other metal object 220. Molten droplets from the two metal wires 240 may interlock and bond to each other and the treated wire or other metal object 220, roughening the surface of the wire or other metal object 220.

Figure 6:
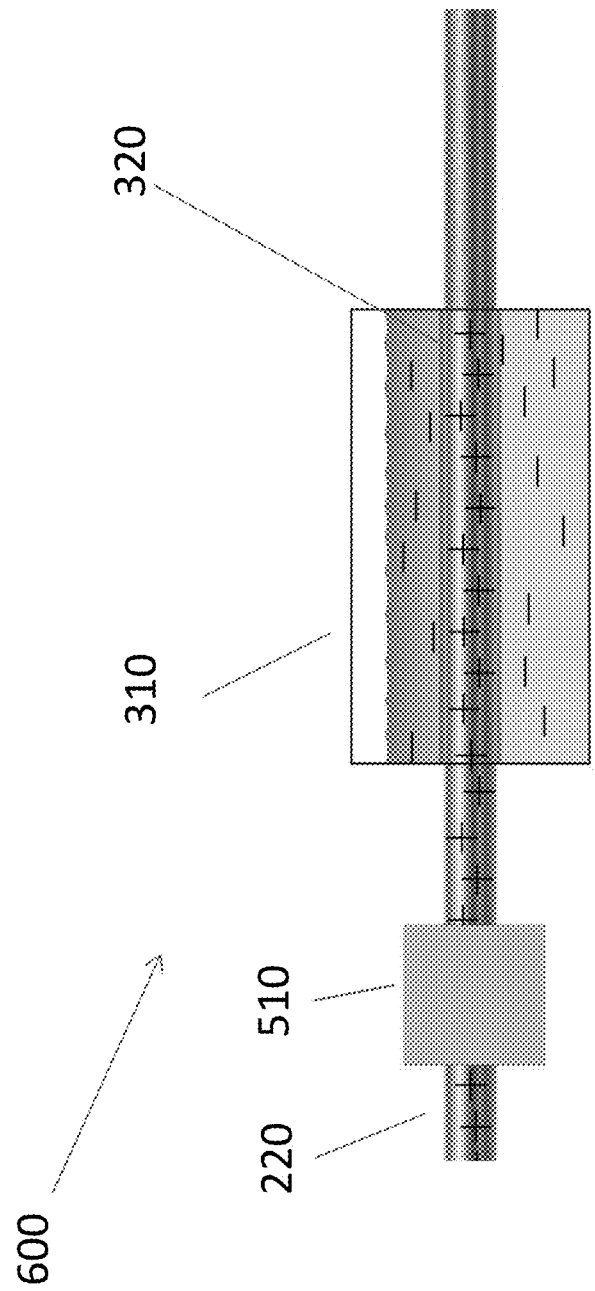
FIG. 6 depicts an electrolytic plasma coating system consistent with at least one embodiment of the present disclosure.

In certain other embodiments, the metal to be deposited is plated onto the surface of the wire or other metal object 220 via electrolytic plasma coating. As depicted in FIG. 6, electrolytic plasma coating system 600 includes infrared heat source 510. Prior to processing, wire or other metal object 220 is passed through infrared heat source 510 to increase the temperature of wire or other metal object 220 to enhance bonding. An electrical charge is applied to wire or other metal object 220 as it passes through liquid bath 310 containing metals with an opposite electrical charge. At the surface of the wire or other metal object 220, the opposite electrical charges of the metal create plasma layer 320 that deposits metals from liquid bath 310 to create a bonded roughened surface on wire or other metal object 220. As one of ordinary skill in the art will appreciate, although FIG. 6 depicts the charge imparted on wire or other metal object 220 as positive and the metals in liquid bath 310 as negative, the charges could be reversed.

Figure 7:
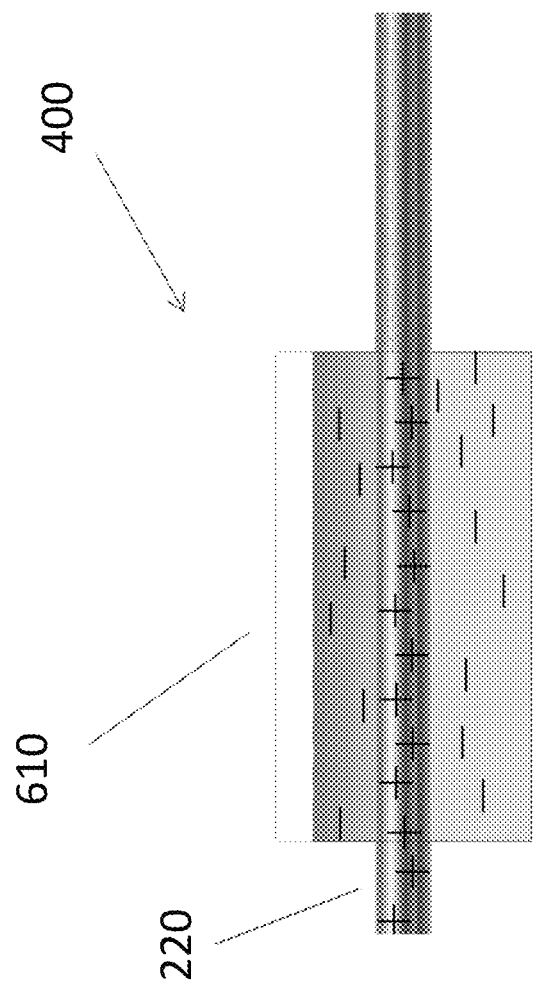
FIG. 7 depicts an electroplating system consistent with at least one embodiment of the present disclosure.

In yet other embodiments, the metal to be deposited is plated onto the surface of the wire or other metal object 220 via electroplating. As depicted in FIG. 7, in electroplating system 400, an electrical charge is applied to wire or other metal object 220 as it passes through liquid bath 610. Liquid bath 610 is an aqueous solution of an oppositely charged electrolyte containing the metal to be electroplated. The metal in the solution bonds electro-statically to wire or other metal object 220, and forms a solid coating over wire or other metal object 220. As one of ordinary skill in the art will appreciate, although FIG. 7 depicts the charge imparted on wire or other metal object 220 as positive and the metals in liquid bath 610 as negative, the charges could be reversed.

FIGS. 8a-8d depict a method of forming a wire consistent with at least one embodiment of the present disclosure. In steel wire cladding process 700, ferrous wire core 110 is provided, as depicted in FIG. 8a. Metal strip 710 is placed alongside ferrous wire core 110, as depicted in FIG. 8b. Metal strip 710 may be composed of, for instance, Zn, Ni, Mo or Fe. Metal strip 710 is bent around ferrous wire core 110 and seam-welded to form a tube which is drawn down to fit tightly over ferrous wire core 110 as shown in FIG. 8c to form metal-covered rod 720. The metal-covered rod 720 diameter may then be reduced, such as for example, by drawing or passing the metal-covered rod 720 through a series of sizing rollers 730 as shown in FIG. 8d, to the desired final diameter. In certain embodiments, as shown in FIG. 8d, the orientation of sizing rollers 730 may alternate. Metal-covered rods 720a-720d depict the reduction in diameter of metal-covered rod 720 as it passes through sizing rollers 730.

FIGS. 9a-9e depict a method of forming a wire consistent with at least one embodiment of the present disclosure. In steel wire cladding process 800, a thin layer of Zn, Ni, or Mo is applied using gas plasma coating, electrolytic plasma, or electroplating as described above to form plated rod 810, as shown in FIG. 9a. The thin layer can be from 2 to 10 microns in thickness, for example. Metal strip 820 is placed alongside plated rod 810, as shown in FIG. 9b. Metal strip 820 may be formed from Zn, Ni, Mo, or Fe, for instance. Metal strip 820 is bent around plated rod 810 and seam-welded to form a tube, as shown in FIG. 9c. The tube is drawn down to fit tightly over plated rod 810 as shown in FIG. 9d to form metal-covered rod 830. The metal-covered rod 830 diameter may then be reduced, such as for example, by drawing or passing the metal-covered rod 830 through a series of sizing rollers 840, as shown in FIG. 9e, to the desired final diameter. In certain embodiments, as shown in FIG. 9e, the orientation of sizing rollers 840 may alternate. Metal-covered rods 830a-830d depict the reduction in diameter of metal-covered rod 830 as it passes through sizing rollers 840.

In certain embodiments, the outer layer 130 of zinc in wires 100 and 200, and the inner zinc layer 150 of wire 300 may be deposited by hot-dipping, electroplating, mechanical bonding, sherardizing or thermal spraying. Hot-dip methods include a continuous process in which long strands of sheet, wire or tubing are continuously fed through a bath of molten zinc. Hot-dip methods also include batch processes in which fabricated parts, including such parts as fasteners, poles or beams, are dipped into molten zinc either individually or in discrete batches. Similarly, zinc electroplating can be performed in a continuous or batch mode.

In certain embodiments of the present disclosure, wire 100, wire 200, wire 300, wire 1000, metal-covered rod 720, and metal-covered rod 830 may be galvanized, such as through hot dip galvanizing process 900 as shown in FIG. 10. Wire 910 (which may include, for example, wire 100, wire 200, wire 300, wire 1000, metal-covered rod 720, or metal-covered rod 830) may be passed through molten Zn bath 920 to form galvanized-coated wire 930. Galvanized-coated wire 930 is wire 910 with an additional layer of hot-dip Zn galvanization.

The foregoing outlines features of several embodiments so that a person of ordinary skill in the art may better understand the aspects of the present disclosure. Such features may be replaced by any one of numerous equivalent alternatives, some of which are disclosed herein. One of ordinary skill in the art should appreciate that they may readily use the present disclosure as a basis for designing or modifying other processes and structures for carrying out the same purposes and/or achieving the same advantages of the embodiments introduced herein. One of ordinary skill in the art should also realize that such equivalent constructions do not depart from the spirit and scope of the present disclosure and that they may make various changes, substitutions, and alterations herein without departing from the spirit and scope of the present disclosure.

What is claimed is:

1. A wire comprising:
   a ferrous wire core;
   an interface layer circumferentially surrounding the ferrous wire core, the interface layer comprising nickel, molybdenum or a nickel alloy;
   an Fe layer circumferentially surrounding the interface layer;
   an outer layer circumferentially surrounding the interface layer, the outer layer comprising zinc or a zinc alloy, and wherein the outer layer circumferentially surrounds the Fe layer.

2. The wire of claim 1, wherein the ferrous wire core is steel.

3. The wire of claim 1, wherein the interface layer has a thickness of between 2 and 60 microns.

4. The wire of claim 1, wherein outer layer has a thickness of between 1 and 50 microns.

5. The wire of claim 1, wherein the outer layer comprises the zinc alloy, and wherein the zinc allow comprises:
   binary Zn—Ni or Zn—Co alloy; or
   ternary Zn—Ni—Co, Zn—Ni—Mo or Zn—Co—Mo alloy.

6. The wire of claim 1, wherein the Fe layer has a thickness of between 2 and 20 microns.

7. The wire of claim 1, further comprising a galvanized zinc coating.

8. A wire comprising:
   a ferrous wire core;
   an inner zinc layer circumferentially surrounding the ferrous wire core;
   an Fe layer circumferentially surrounding the inner zinc layer; and
   an interface layer circumferentially surrounding the Fe layer, the interface layer comprising nickel or molybdenum.

9. The wire of claim 8, wherein the inner zinc layer has a thickness of between 2 and 50 microns.

10. The wire of claim 8, further comprising a galvanized zinc coating.

* * * * *